(12) United States Patent
Wang (10) Patent No.: US 11,649,332 B2
(45) Date of Patent: May 16, 2023

(54) METHOD OF PROCESSING LIQUID CRYSTAL POLYMER FILM

(71) Applicant: AZOTEK CO., LTD., Taoyuan (TW)

(72) Inventor: Li-Hua Wang, Taoyuan (TW)

(73) Assignee: AZOTEK CO., LTD., Taoyuan (TW)

( * ) Notice: Subject to any disclaimer, the term of this patent is extended or adjusted under 35 U.S.C. 154(b) by 0 days.

(21) Appl. No.: 17/661,278

(22) Filed: Apr. 28, 2022

(65) Prior Publication Data

US 2022/0251315 A1 Aug. 11, 2022

Related U.S. Application Data

(62) Division of application No. 16/684,605, filed on Nov. 15, 2019, now Pat. No. 11,597,806.

(60) Provisional application No. 62/768,117, filed on Nov. 16, 2018.

(30) Foreign Application Priority Data

Oct. 30, 2019 (TW) .................................. 108139312

(51) Int. Cl.
| | | |
|---|---|---|
| C08J 5/18 | (2006.01) |
| B32B 37/10 | (2006.01) |
| B32B 38/10 | (2006.01) |
| H05K 1/03 | (2006.01) |

(Continued)

(52) U.S. Cl.
CPC ................. *C08J 5/18* (2013.01); *B32B 15/08* (2013.01); *B32B 37/10* (2013.01); *B32B 38/10* (2013.01); *H05K 1/0353* (2013.01); *H05K 3/4644* (2013.01); *H05K 2201/0141* (2013.01)

(58) Field of Classification Search
CPC . C08J 5/18; B32B 15/08; B32B 37/10; B32B 38/10; B32B 43/006; B32B 2305/55; H05K 1/0353; H05K 1/0393; H05K 3/4644; H05K 3/022; H05K 2201/0141; H05K 2201/068; H05K 2203/1545; Y10T 156/1168; Y10T 156/1174; Y10T 156/195;
(Continued)

(56) References Cited

U.S. PATENT DOCUMENTS

| | | | |
|---|---|---|---|
| 6,616,796 B1 * | 9/2003 | Onodera | B32B 38/0036 428/1.2 |
| 2008/0107833 A1 * | 5/2008 | Onodera | B29C 66/91933 156/324 |

FOREIGN PATENT DOCUMENTS

| | | |
|---|---|---|
| CN | 1616526 A | 5/2005 |
| CN | 100343313 C | 10/2007 |
| CN | 101056758 B | 7/2012 |

(Continued)

OTHER PUBLICATIONS

Machine translation of WO 2014/034917 date unknown.*

*Primary Examiner* — John L Goff, II
(74) *Attorney, Agent, or Firm* — CKC & Partners Co., LLC (57) ABSTRACT

A method of processing liquid crystal polymer film is provided. The method includes the following steps. A metal substrate is provided. A liquid crystal polymer film is provided. The liquid crystal polymer film and the metal substrate are laminated to form a composite layer. The composite layer is heated at a first temperature and a processed liquid crystal polymer film is obtained through the separation of the heated liquid crystal polymer film from the substrate. A processing device of liquid crystal polymer film is further provided, including a lamination member, a transport member, a heating member, and a separation member.

12 Claims, 5 Drawing Sheets

(51) Int. Cl.
    *H05K 3/46*         (2006.01)
    *B32B 15/08*       (2006.01)

(58) Field of Classification Search
    CPC .............. Y10T 156/1956; B29C 41/42; B29K 2105/0079
    USPC ........................................ 156/247, 715, 760
    See application file for complete search history.

(56) References Cited

FOREIGN PATENT DOCUMENTS

| | | | |
|---|---|---|---|
| JP | 2000347031 A | 12/2000 | |
| JP | 2005-103989 A | 4/2005 | |
| JP | 2010000795 A | 1/2010 | |
| JP | 2014046510 A | 3/2014 | |
| JP | 2018130959 A | 8/2018 | |
| JP | WO2017154811 A1 | 1/2019 | |
| KR | 100349952 B1 | 8/2002 | |
| TW | 200621480 A | 7/2006 | |
| TW | 201141922 A | 12/2011 | |
| WO | WO-2014034917 A1 * | 3/2014 | ............. B29C 59/02 |
| WO | 2016114262 A1 | 7/2016 | |

\* cited by examiner

METHOD OF PROCESSING LIQUID CRYSTAL POLYMER FILM

CROSS-REFERENCE TO RELATED APPLICATION

The present application is a Divisional Application of the U.S. application Ser. No. 16/684,605, filed on Nov. 15, 2019, now U.S. Pat. No. 11,597,806, which claims priority to U.S. Provisional Application Ser. No. 62/768,117, filed Nov. 16, 2018, and Taiwan Application Serial Number 108139312, filed Oct. 30, 2019, all of which are herein incorporated by reference in their entireties.

BACKGROUND

Field of Invention

The present disclosure relates to a method and a device of processing liquid crystal polymer films. More particularly, the present disclosure relates to a processing method and a device for increasing the melting temperature or the liquid crystal transition temperature of a liquid crystal polymer film.

Description of Related Art

The liquid crystal polymer film is known to have low moisture absorbability, excellent heat resistance, chemical resistance and dielectric properties. The liquid crystal polymer film, serving as a dielectric material in a printed circuit board or the like, can reduce adverse effects caused by RC delay. Therefore, the commercialization of the liquid crystal polymer film is rapidly developing. Nevertheless, in the production of multi-layered boards, the heat received by each layer is inconsistent during high-temperature lamination, which is caused by the different distances between each dielectric layer and the heat source. As a result, the properties of the obtained dielectric layers might be different when the dielectric layers have the same melting point (or the same liquid crystal transition temperature). Therefore, how to increase the melting point (or the liquid crystal transition temperature) of the liquid crystal polymer film is remained to be resolved in order to obtain liquid crystal polymer films having different melting points (or the different liquid crystal transition temperature).

SUMMARY

In order to achieve the abovementioned purpose, the present disclosure provides a method of processing a liquid crystal polymer film. The method includes the following steps: providing a substrate; providing a liquid crystal polymer film; laminating the liquid crystal polymer film with the substrate to form a composite layer; heating the composite layer at a temperature; and separating the heated liquid crystal polymer film from the substrate to obtain a processed liquid crystal polymer film.

According to an embodiment of the present disclosure, the substrate includes a metal substrate having a flat surface without a patterned texture.

According to an embodiment of the present disclosure, the substrate includes a patterned metal substrate.

According to an embodiment of the present disclosure, the patterned metal substrate includes a trench and two strip-shaped platforms, and the strip-shaped platforms protrude from two sides of the trench.

According to an embodiment of the present disclosure, the patterned metal substrate further includes a plurality of openings recessed from the strip-shaped platforms at the two sides of the trench, and the openings are connected to the trench.

According to an embodiment of the present disclosure, the step of laminating the liquid crystal polymer film with the substrate includes laminating the liquid crystal polymer film on the trench of the patterned metal substrate.

According to an embodiment of the present disclosure, the laminated liquid crystal polymer film has a top that is lower than a top surface of the strip-shaped platforms.

According to an embodiment of the present disclosure, after the step of laminating the liquid crystal polymer film with the substrate, the method further includes rolling the composite layer into a roll.

According to an embodiment of the present disclosure, each of the steps of laminating the liquid crystal polymer film with the substrate, heating the composite layer at the temperature, and separating the heated liquid crystal polymer film from the substrate, includes continuously transporting the composite layer.

According to an embodiment of the present disclosure, the step of laminating the liquid crystal polymer film with the substrate and heating the composite layer at the temperature are performed simultaneously.

According to an embodiment of the present disclosure, the step of heating the composite layer at the temperature includes heating the composite layer for a time period of 1 hour to 24 hours.

According to an embodiment of the present disclosure, during the step of heating the composite layer at the temperature, the temperature is lower than the melting point or the liquid crystal transition temperature of the liquid crystal polymer film before heating.

According to an embodiment of the present disclosure, the step of heating the composite layer at the temperature includes performing a series of heating stages to heat the composite layer.

According to an embodiment of the present disclosure, a heating temperature of each heating stage is higher than a heating temperature of a previous stage.

According to an embodiment of the present disclosure, the step of separating the heated liquid crystal polymer film from the substrate includes using a peeling roller member having an upper peeling roller and a lower peeling roller to separate the liquid crystal polymer film from the substrate.

In order to achieve the foregoing purpose, another aspect of the present disclosure is to provide a device of processing a liquid crystal polymer. The device includes a lamination member, a transport member, a heating member, and a separation member. The lamination member is configured to laminate a liquid crystal polymer film with a substrate to form a composite layer. The transport member is disposed along a path and configured to transport the composite layer through the path, in which the lamination member is located approximately at a beginning end of the path. The heating member is disposed on the lamination member, at least one side of the path for transporting the composite layer, or the combination described above, and the heating member is configured to heat the composite layer. The separation member is located at a terminal end of the path, and the separation member is configured to separate the heated liquid crystal polymer film from the substrate.

According to an embodiment of the present disclosure, the liquid crystal polymer film includes a thermoplastic liquid crystal polymer film or a soluble liquid crystal polymer film.

According to an embodiment of the present disclosure, the soluble liquid crystal polymer includes a repeating unit represented by a following formula (I):

(I)

in which Ar is 1,4-phenylene, 1,3-phenylene, 2,6-naphthalene or 4,4'-biphenylene, Y is O or NH, and X is amino, amide group, imido or imino, am idino, aminocarbonylamino, am inothiocarbonyl, am inocarbonyloxy, aminosulfonyl, aminosulfonyloxy, aminosulfonylamino, carboxyl ester, (carboxyl ester)amino, (alkoxycarbonyl)oxy, alkoxycarbonyl, hydroxyamino, alkoxyamino, cyanato, isocyanato, or a combination of the abovementioned groups.

According to an embodiment of the present disclosure, the substrate includes a metal substrate.

According to an embodiment of the present disclosure, the substrate is a metal substrate having a flat surface and without a patterned texture.

According to an embodiment of the present disclosure, the lamination member includes an upper roller and a lower roller.

According to an embodiment of the present disclosure, the transport member includes a set of rollers.

According to an embodiment of the present disclosure, the heating member includes an infrared lamp.

According to an embodiment of the present disclosure, the heating member includes a plurality of heating zones sequentially arranged along the path. Each of the heating zones is configured to be operated at a temperature, and the temperatures of the heating zones are increased in sequence from the beginning end of the path.

According to an embodiment of the present disclosure, the heating member is configured to heat the composite layer to a temperature that is lower than a melting point or a liquid crystal transition temperature of the liquid crystal polymer film.

According to an embodiment of the present disclosure, the separation member includes a peeling-roller member.

The foregoing currents a simplified summary of the disclosure in order to provide a basic understanding to the reader. This summary is not an extensive overview of the disclosure and it does not identify key/critical elements of the current invention or delineate the scope of the current invention.

BRIEF DESCRIPTION OF THE DRAWINGS

The invention can be more fully understood by reading the following detailed description of the embodiment, with reference made to the accompanying drawings as follows:

FIG. 1A to FIG. 4 individually depict cross view of the schematic diagrams of processing liquid crystal polymer film in the different steps of the process according to an embodiment of the present disclosure;

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. Thus, uses of the phrases "in an embodiment" in various places throughout the specification are not necessarily all referring to the same embodiment. Furthermore, the particular features, structures, or characteristics may be combined in any suitable manner in one or more embodiments. It must be noted that as used herein and in the appended claims, the singular forms include plural referents unless the context clearly dictates otherwise. In the embodiment of the present disclosure, at least one of the embodiments of the present disclosure refers to a specific feature, structure or feature, and thus, in an embodiment, such an embodiment.

In the following detailed description, numerous specific details are described in details to provide a thorough understanding of the disclosed embodiments. It will be apparent, however, that one or more embodiments may be practiced without these specific details. In other instances, well-known structures and devices are schematically shown in order to simplify the drawings.

Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The liquid crystal polymer films in the present disclosure are not limited to specific material. For example, the liquid crystal polymer film may be a thermoplastic liquid crystal polymer and/or a soluble liquid crystal polymer.

In some embodiments, the thermoplastic liquid crystal polymer is prepared from the compounds that may be classified into four categories described below.

The first category: aromatic or aliphatic dicarboxylic acids (please refer to Table 1 below).

TABLE 1

Illustrative examples of the chemical formulas of aromatic or aliphatic dicarboxylic acids HOOC(CH$_2$)$_n$COOH (n is an integer from 2 to 12)

The second category: aromatic hydroxycarboxylic acids (please refer to Table 2 below).

TABLE 2

Illustrative examples of the chemical formulas of aromatic hydroxycarboxylic acids (X: hydrogen atom or halogen atom, or lower alkyl, phenyl, etc)

TABLE 2-continued

Illustrative examples of the chemical formulas of aromatic hydroxycarboxylic acids

The third category: aromatic or aliphatic dihydroxy compounds (please refer to Table 3 below)

TABLE 3

Illustrative examples of the chemical formulas of aromatic or aliphatic dihydroxy compounds (X: hydrogen atom or halogen atom, or lower alkyl, phenyl, etc.)

(Y: —O—, —CH$_2$—, —S—, etc.)

HO(CH$_2$)$_n$OH (n is an integer from 2 to 12)

The fourth category: aromatic diamines, aromatic hydroxylamines and aromatic aminocarboxylic acids (please refer to Table 4 below)

TABLE 4

Illustrative examples of the chemical formulas of aromatic diamines, aromatic hydroxylamines and aromatic aminocarboxylic acids TABLE 4-continued Illustrative examples of the chemical formulas of aromatic diamines, aromatic hydroxylamines and aromatic aminocarboxylic acids Illustrative examples of the liquid crystal polymers prepared from the compounds shown in Tables 1-4 may be a copolymer (a) to (e), that have repeating units in structure illustrated in Table 5 below.

TABLE 5

Structural units of the representative examples of thermoplastic liquid crystal polymers (a) Copolymer of (b) Copolymer of (c) Copolymer of

TABLE 5-continued

Structural units of the representative examples of thermoplastic liquid crystal polymers (d) Copolymer of (e) Copolymer of (Y: —O—, —CH$_2$—, —S— or the like)

In various embodiments, the soluble liquid crystal polymer includes a repeating unit represented by the following formula (I):

(I)

wherein Ar is 1,4-phenylene, 1,3-phenylene, 2,6-naphthalene or 4,4'-biphenylene, Y is O or NH, and X is amino, amide group, imido or imino, amidino, am inocarbonylam ino, am inothiocarbonyl, am inocarbonyloxy, am inosulfonyl, aminosulfonyloxy, aminosulfonylamino, carboxyl ester, (carboxyl ester)amino, (alkoxycarbonyl)oxy, alkoxycarbonyl, hydroxyamino, alkoxyamino, cyanato, isocyanato, or a combination thereof, but not limited thereto.

Figure 1A:
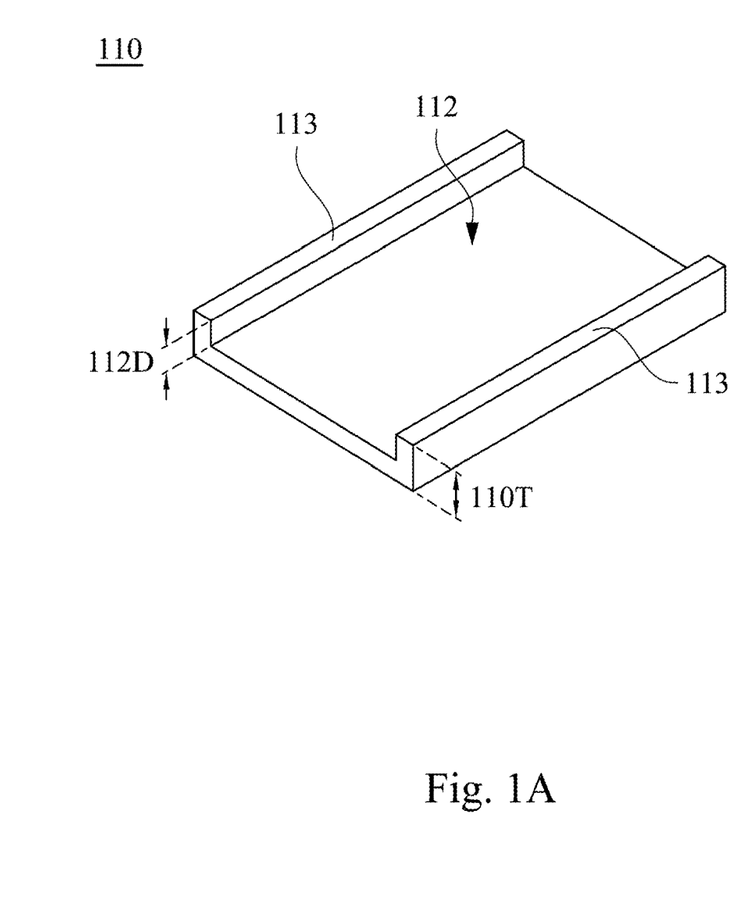
Figure 1B:
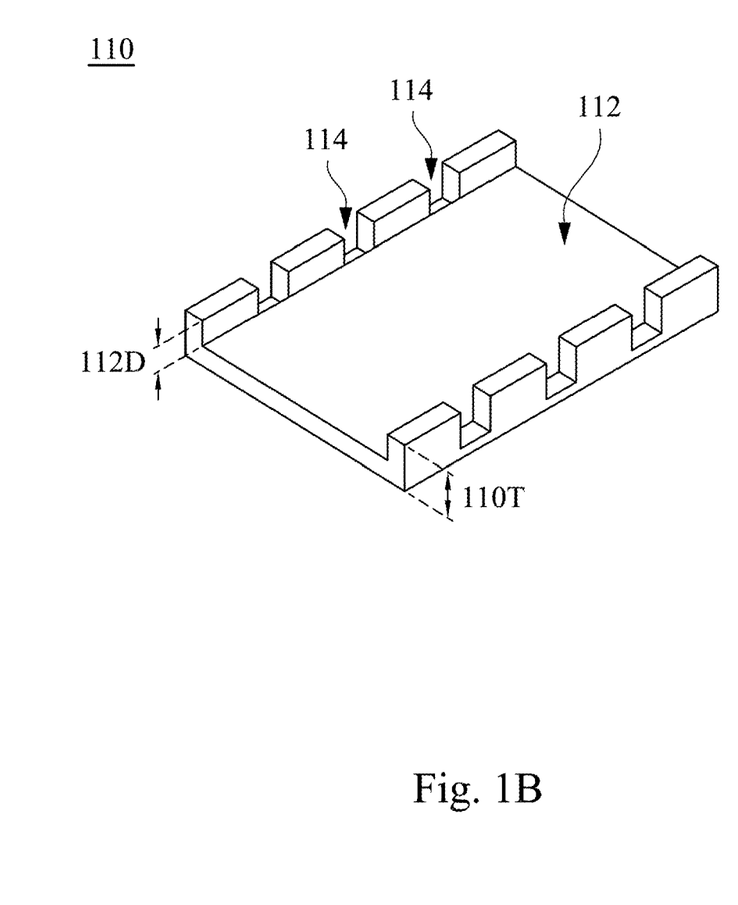

The present disclosure provides a method of processing a liquid crystal polymer film. The method includes the following steps: providing a substrate; providing a liquid crystal polymer film; laminating the liquid crystal polymer film with the substrate to form a composite layer; heating the composite layer at a temperature; and separating the heated liquid crystal polymer film from the composite layer to obtain a processed liquid crystal polymer film. The melting point of the liquid crystal polymer film after the heating step is higher than that before the heating step. The liquid crystal polymer films having different melting points (or liquid crystal transition temperature) can be obtained by the method describe above. The liquid crystal polymer films can be applied for the dielectric layers, which receive different heat, in order to enhance the stability among the laminated dielectric layers. FIG. 1A, FIG. 1B, FIG. 2, FIG. 3, and FIG. 4 are schematic diagrams illustrating the method of processing liquid crystal polymer film in different steps, according to an embodiment of the present disclosure; FIG. 5 depicts a cross-sectional view of a device for processing a liquid crystal polymer film, according to an embodiment of the present disclosure Referring to FIG. 1A, FIG. 1B, and FIG. 5, in some embodiments of the present disclosure, the substrate includes a metal substrate 140 shown in FIG. 5 (e.g. a metal substrate having a flat surface without a patterned texture), or patterned metal substrate 110 shown in FIG. 1. As shown in FIG. 1A and FIG. 1B, the patterned metal substrate 110 has a trench 112. It should be noted that the trench 112 does not penetrate through the patterned metal substrate 110, and the trench 112 extends along a long side of the patterned metal substrate 110 and is used to place the liquid crystal polymer film to be treated in the subsequent process. In some embodiments, the patterned metal substrate 110 may be a copper substrate, an aluminum substrate, a nickel substrate, a palladium substrate, or a tin substrate, but is not limited thereto. The thickness 110T of the patterned metal substrate 110 is not limited to certain value. For instance, the thickness 110T may be 100 μm to 500 μm, such as 150 μm, 200 μm, 250 μm, 300 μm, 350 μm, 400 μm, or 450 μm. The depth 112D of the trench 112 is not limited to certain value, either. For instance, the depth 112D may be 50 μm to 250 μm, such as 75 μm, 100 μm, 125 μm, 150 μm, 175 μm, 200 μm, or 250 μm. It can be understood that the thickness 110T of the patterned metal substrate 110 and the depth 112D of the trench 112 can be adjusted according to the thickness of the liquid crystal polymer film.

In one embodiment, the patterned metal substrate 110 illustrated in FIG. 1A may be formed by a photolithography process, in which a first photoresist is formed on a flat metal substrate, and an etching process to remove the central portion of the metal substrate. In other words, the patterned metal substrate 110 illustrated in FIG. 1A includes a trench 112 and two strip-shaped platforms 113. The strip-shaped platforms 113 protrude from two sides of the trench 112.

In another embodiment, a second photoresist is formed on a flat metal substrate by a photolithography process, and then the central portion and parts of the two sides of the metal substrate are etched away so as to form the patterned metal substrate 110 illustrated in FIG. 1B. In addition to the trench 112, the patterned metal substrate 110 illustrated in FIG. 1B further includes a plurality of openings 114 located at two sides of the trench 112, and the openings 114 are connected to the trench 112. In some embodiments, the openings 114 located at two sides of the trench 112 may be symmetrically or asymmetrically arranged.

Figure 2:
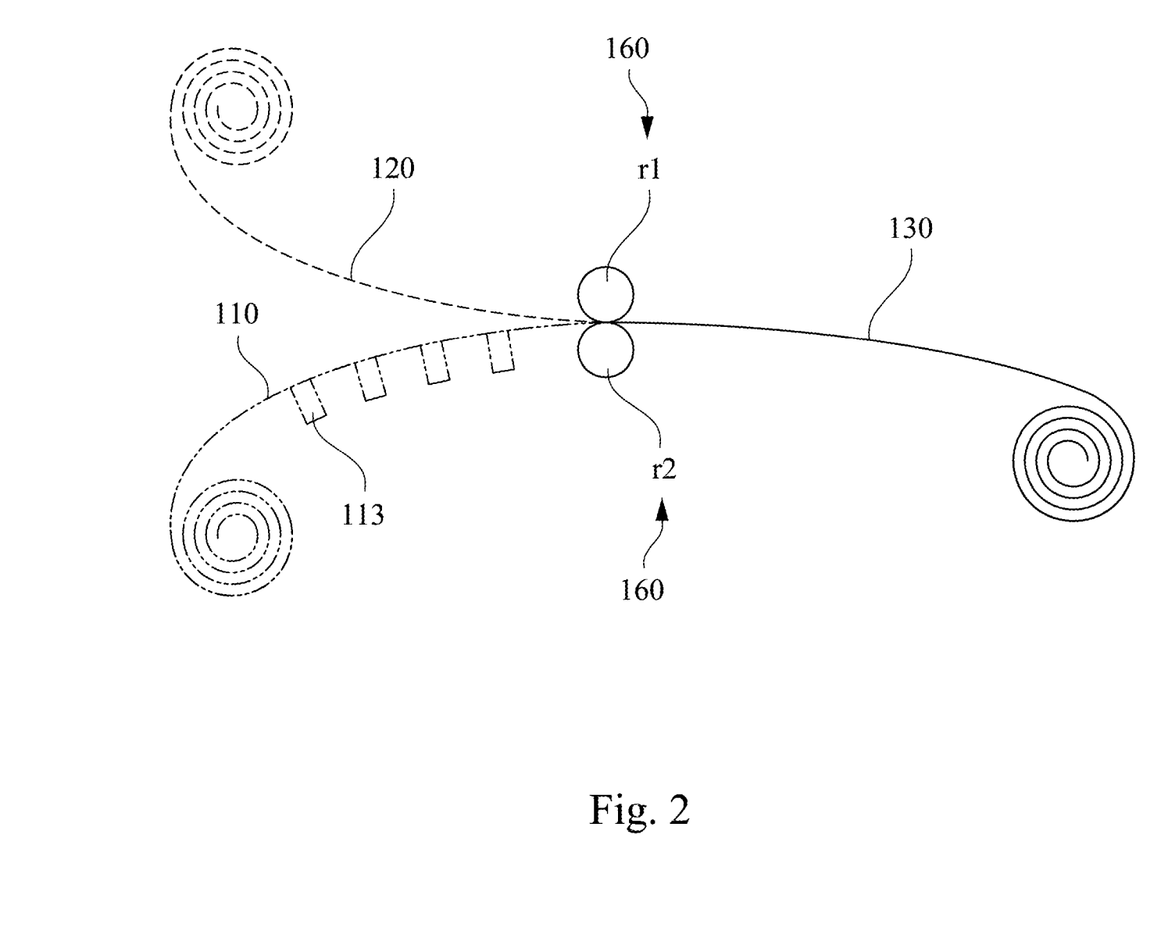
Figure 3:
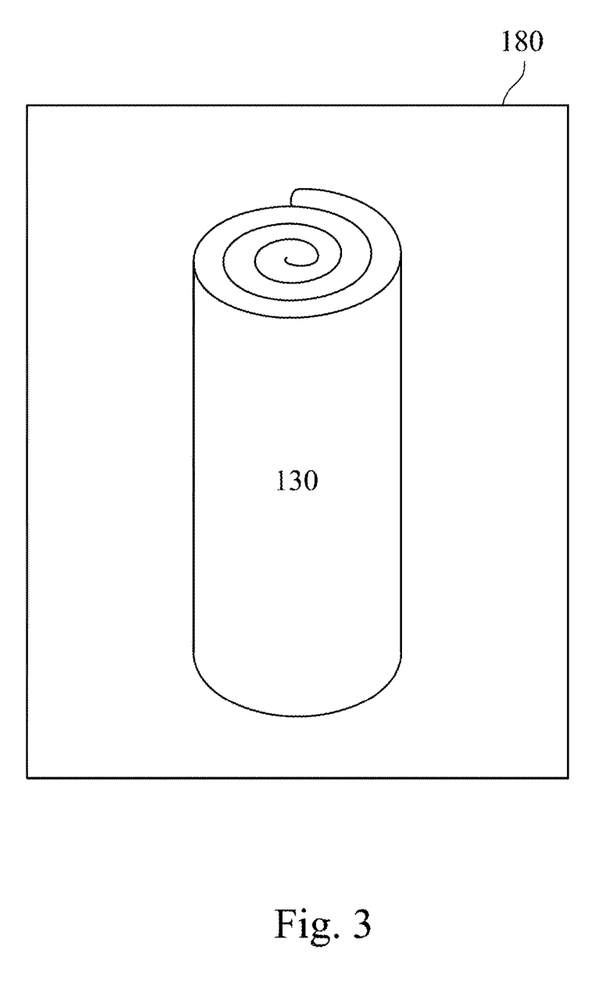

In some embodiments of the present disclosure, referring to FIG. 2, a liquid crystal polymer film 120 is laminated with the patterned metal substrate 110 to form a first composite layer 130. In particular, the liquid crystal polymer film 120 is laminated into the trench 112 of the patterned metal substrate 110. In some embodiments, the liquid crystal polymer film 120 may be a thermoplastic liquid crystal polymer film or a soluble liquid crystal polymer film. It should be noted that the thermoplastic liquid crystal polymer film and/or soluble liquid crystal polymer film used in this step has a melting point or a liquid crystal transition temperature. Both the melting point and the liquid crystal transition temperature can be determined by measuring the temperature at which the main endothermic peak appears using a differential scanning calorimeter. In some embodiments, the steps of laminating the liquid crystal polymer film with the metal substrate and heating the composite layer at a specific temperature are performed simultaneously. As shown in FIG. 2, the heating lamination can be performed continuously by using lamination member 160, for example, and the liquid crystal polymer film and the metal substrate can be transported through the upper roller r1 and the lower roller r2 (roll-to-roll). That is, the liquid crystal polymer film and the metal substrate are simultaneously heated and laminated together through a pair of pressure-heating rollers including the upper roller r1 and the lower roller r2. In yet some embodiments, as shown in FIG. 3, after the step of laminating the liquid crystal polymer film with the substrate, the method further includes a step of rolling the first composite layer 130 into a roll, which is easier to be transferred to a subsequent process for heat treatment. Besides, since the liquid crystal polymer film 120 is located at the trench 112 of the patterned metal substrate 110, the convex portions on two sides of the rolled first composite layer 130 facilitate the liquid crystal polymer film 120 to be separated from other portions.

In another embodiment, while the liquid crystal polymer film 120 in a thickness of about 50 μm is selected for lamination, a patterned metal substrate 110 having a thickness of about 150 μm can be used, in which a trench 112 having a depth of about 75 μm is formed by etching. In another embodiment, while the liquid crystal polymer film 120 in a thickness of about 80 μm is selected for lamination, a patterned metal substrate 110 having a thickness of about 200 μm can be used, in which a trench 112 having a depth of about 100 μm is formed by etching. It should be noted that after the lamination, the liquid crystal polymer film 120 located at the trench 112 should have a top that is lower than the top surface of the strip-shaped platform 113 so that the adhesion of the liquid crystal polymer film 120 to the patterned metal substrate 110 may be avoided during the subsequent heating process of the rolled first composite layer 130. The embodiments described hereinbefore are merely examples. The thickness of the patterned metal substrate 110 and the depth of the trench 112 can be adjusted according to the thickness of the liquid crystal polymer film 120.

In some embodiments of the present disclosure, the step of heating the composite layer at a specific temperature includes heating the composite layer for a time period of 1 hour to 24 hours, and the specific temperature is lower than the melting point or the liquid crystal transition temperature of the liquid crystal polymer film 120. It should be noted that this step can increase the melting point or the liquid crystal transition temperature of the liquid crystal polymer film 120 of the composite layer. In some embodiments, the composite layer can be heated for a time period of 1 hour, 2 hours, 3 hours, 4 hours, 5 hours, 6 hours, 7 hours, 8 hours, 9 hours, 10 hours, 11 hours, 12 hours, 13 hours, 14 hours, 15 hours, 16 hours, 17 hours, 18 hours, 19 hours, 20 hours, 21 hours, 22 hours, 23 hours or 24 hours. By such a long-time heating treatment, the molecular weight of the liquid crystal polymer film can be increased, thereby increasing the melting point or the liquid crystal transition temperature of the liquid crystal polymer film. Therefore, it can be understood that the longer the time period of heating is, the higher the melting point or the liquid crystal transition temperature of the heated liquid crystal polymer film in the composite layer will be.

In some embodiments, the step of heating the composite layer can be performed in a heating member (e.g. a hot air circulating oven, a ceramic heater, or an oven). Referring to FIG. 3, in the practical operation, the rolled first composite layer 130 is advantageous to be directly disposed in the heating member 180 for a long-time heating because the space of heating members 180 (e.g., an oven) has a limit. It can be understood that for heating evenly on both inner side and outer side of the rolled liquid crystal polymer film 120, the patterned metal substrate 110 serves as a good heat conduction media, reducing the temperature difference between the center region and the peripheral region of the liquid crystal polymer film 120. It should be emphasized that while the patterned metal substrate 110 shown in FIG. 1B and FIG. 2 is employed in the first composite layer 130, the hot air can directly enter the trenches 112 through the openings 114 and heat the liquid crystal polymer film 120. This design can reduce the temperature difference between the center region and the peripheral region of the liquid crystal polymer film 120.

In some embodiments, as shown in FIG. 3, the specific temperature may be 30° C. lower than the melting point (or the liquid crystal transition temperature) of the liquid crystal polymer film 120 (prior to the heating). The specific temperature may be 25° C. lower than the melting point (or the liquid crystal transition temperature) of the liquid crystal polymer film 120 (prior to the heating). The specific temperature may be 20° C. lower than the melting point (or the liquid crystal transition temperature) of the liquid crystal polymer film 120 (prior to the heating). The specific temperature may be 15° C. lower than the melting point (or the liquid crystal transition temperature) of the liquid crystal polymer film 120 (prior to the heating). The specific temperature may be 10° C. lower than the melting point (or the liquid crystal transition temperature) of the liquid crystal polymer film 120 (prior to the heating). The specific temperature may be 5° C. lower than the melting point (or the liquid crystal transition temperature) of the liquid crystal polymer film 120 (prior to the heating). This invention is not limited the temperatures described hereinbefore. It should be noted that the specific temperature may not be higher than the melting point or the liquid crystal transition temperature of the liquid crystal polymer film 120 prior to the heating.

In another embodiment, the composite layer can be subjected to a series of heating stages. For example, the first stage: heating the composite layer at the temperature 30° C. lower than the melting point (or the liquid crystal transition temperature) of the liquid crystal polymer film 120 (prior to the heating) for about 2 hours; the second stage: heating the composite layer at a temperature 20° C. lower than the melting point (or the liquid crystal transition temperature) of the liquid crystal polymer film 120 (prior to the heating) for about 3 hours; the nth stage: heating the composite layer at a temperature 5° C. lower than the melting point (or the liquid crystal transition temperature) of the liquid crystal polymer film 120 (prior to the heating) for about 1 hour. It should be noted that in the series of heating stages, the heating temperature of each heating stage should be higher than the heating temperature of the previous stage, and the time period of heating can be adjusted according to the demand.

Figure 4:
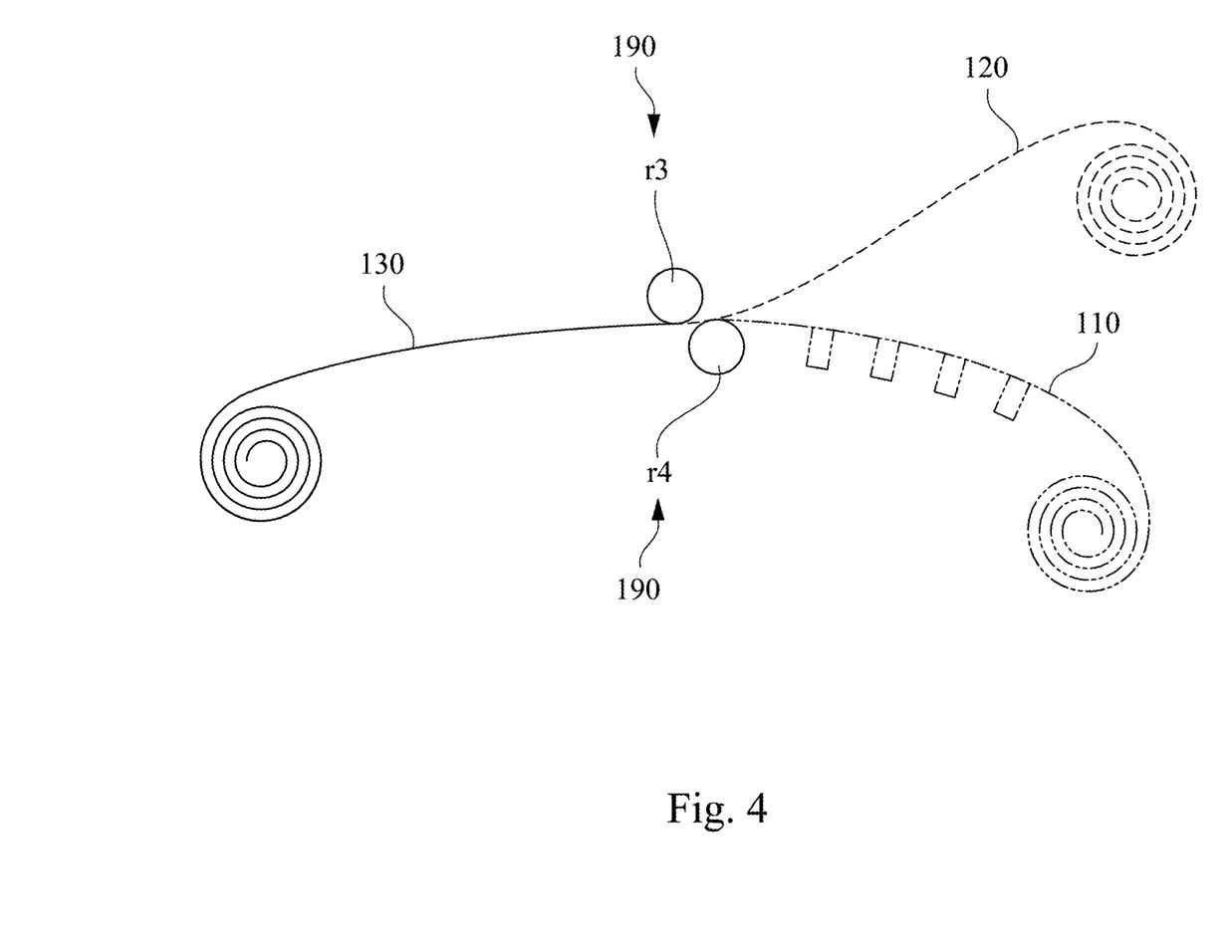
Figure 5:
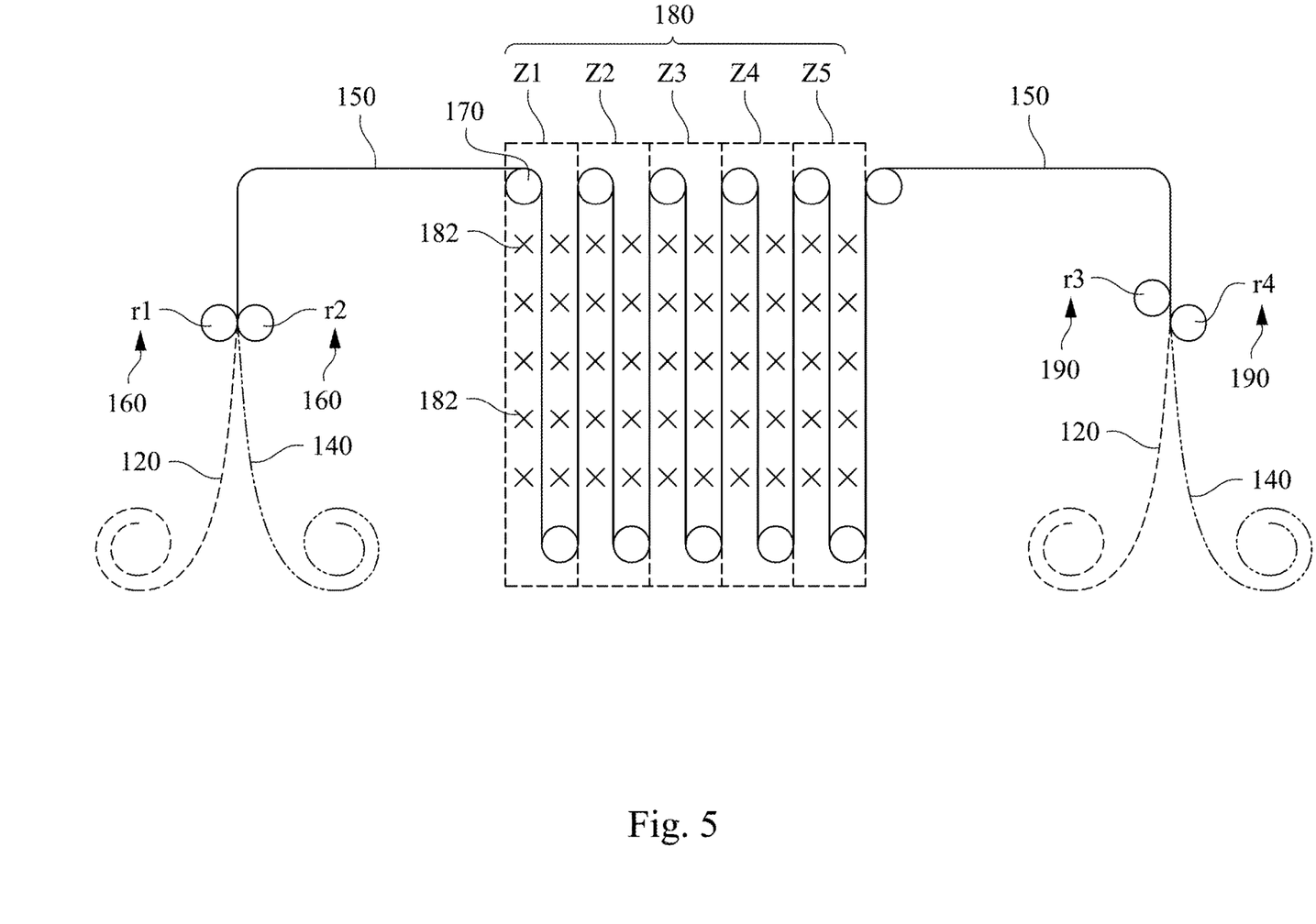
FIG. 5 depicts a cross view of the schematic diagram of processing liquid crystal polymer film according to another embodiment of the present disclosure.

In some embodiments of the present disclosure, the step of separating the heated liquid crystal polymer film 120 from the composite layer is illustrated in FIG. 4. The separation method is not particularly limited. In one embodiment, a peeling-roller member may be used to separate the liquid crystal polymer film 120 from the substrate 110, in which the upper peeling roller r3 and lower peeling roller r4 are used. It should be noted that, the melting point or the liquid crystal transition temperature of the liquid crystal polymer film 120 after the heating is higher than that before the heating.

In some embodiments of the present disclosure, the processing method can be performed in a continuous manner. The composite layer is continuously transported to perform the steps of laminating the liquid crystal polymer film with the substrate, heating the composite layer at a temperature, and separating the heated liquid crystal polymer film from the substrate in sequence. Referring to FIG. 5, a second composite layer 150 is formed by laminating the liquid crystal polymer film 120 with the metal substrate 140. Then, the second composite layer 150 is heated at specific temperatures. Further, the heated liquid crystal polymer film 120 is separated from metal substrate 140 to obtain a processed liquid crystal polymer film 120. Between the foregoing steps, the second composite layer 150 is continuously transported by using the transport member 170. It should be noted that the difference between the discontinuous process and the continuous process is in that each step of the continuous process can be continuously executed in the same processing device. Furthermore, in some embodiments, the metal substrate 140 has a flat surface without a patterned texture on which the liquid crystal polymer film 120 is formed.

Another aspect of the present disclosure is to provide a device of processing a liquid crystal polymer that can continuously process the liquid crystal polymer. The processing device includes a lamination member 160, a transport member 170, a heating member 180, and a separation member 190 (as shown in FIG. 5). The lamination member 160 is used to laminate the liquid crystal polymer film 120 with the substrate (for example, the metal substrate 140) to form a composite layer. The transport member 170 is disposed along a path and configured to transport the composite layer through the path, in which the lamination member 160 is located approximately at a beginning end of the path. The heating member 180 is disposed on the lamination member 160, at least one side of the path for transporting the composite layer or a combination thereof, and the heating member 180 is configured to heat the composite layer at a specific temperature. The separation member 190 is located approximately at a terminal end of the path and configured to separate the heated liquid crystal polymer film 120 from the substrate.

In some embodiments of the present disclosure, at first, the lamination member 160 is used to laminate the liquid crystal polymer film 120 with the metal substrate 140, thereby forming a composite layer. In some embodiments, the liquid crystal polymer film 120 may be a thermoplastic liquid crystal polymer film or a soluble liquid crystal polymer film. The substrate may be used to support the liquid crystal polymer film, and it may be a metal substrate (for example, a copper substrate, an aluminum substrate, a nickel substrate, a palladium substrate or a tin substrate), but is not limited thereto. It should be noted that the thermoplastic liquid crystal polymer film or soluble liquid crystal polymer film used in this step has a melting point or a liquid crystal transition temperature. Both the melting point and the liquid crystal transition temperature can be determined by measuring the temperature at which the main endothermic peak appears by using a differential scanning calorimeter. In some embodiments, referring to FIG. 5, the metal substrate 140 has a flat surface without a patterned texture. A second composite layer 150 is formed by laminating the liquid crystal polymer film 120 with the metal substrate 140 having a flat surface without a patterned texture. In some embodiments, as shown in FIG. 5, the lamination member 160 includes an upper roller and a lower roller. In specifics, the liquid crystal polymer film and the metal substrate are continuously transported through the upper roller r1 and the lower roller r2 (roll-to-roll) so that the liquid crystal polymer film and the metal substrate are simultaneously heated and laminated together through a pair of pressure-heating rollers including the upper roller r1 and the lower rollers r2.

In some embodiments of the present disclosure, the transport member 170 transports the composite layer through a path, which has a range involving approximately the lamination member 160, the heating member 180, and the separation member 190. In some embodiments, the transport member 170 includes a transport station or a set of rollers, as shown in FIG. 5. The set of rollers may rotate to tow and transport the second composite layer 150 through the path.

In some embodiments of the present disclosure, as shown in FIG. 5, the heating member 180 includes one or more infrared lamps 182. The heating member 180, using the infrared lamp 182, provides the heat treatment to the second composite layer 150. In some embodiments, the composite layer can be heated at the specific temperature by the heating member 180 for a time period of 1 hour to 24 hours, and the specific temperature may be lower than the melting point or the liquid crystal transition temperature of the liquid crystal polymer film 120 (prior to heating). It should be noted that this step can increase the melting point or the liquid crystal transition temperature of the liquid crystal polymer film 120 in the composite layer. In some embodiments, the time period of heating may be 1 hour, 2 hours, 3 hours, 4 hours, 5 hours, 6 hours, 7 hours, 8 hours, 9 hours, 10 hours, 11 hours, 12 hours, 13 hours, 14 hours, 15 hours, 16 hours, 17 hours, 18 hours, 19 hours, 20 hours, 21 hours, 22 hours, 23 hours or 24 hours. By such a long-time heating, the molecular weight of the liquid crystal polymer film 120 can be increased, thereby increasing the melting point or the liquid crystal transition temperature of the liquid crystal polymer film 120. Therefore, it can be understood that the longer the time period of heating, the higher the melting point or liquid crystal transition temperature of the heated liquid crystal polymer film 120 in the composite layer will be.

In some embodiments, the heating member is arranged along the path to form a heating zone. In some embodiments, a plurality of heating zones may be formed. As shown in FIG. 5, the continuous processing device includes five heating zones, Z1, Z2, Z3, Z4, and Z5 sequentially. More particularly, each of the heating zones (Z1, Z2, Z3, Z4, and Z5) includes a plurality of infrared lamps 182.

In some embodiments, as shown in FIG. 5, the second composite layer 150 is heated at a specific temperature in each of the heating zones (Z1, Z2, Z3, Z4, and Z5). For example, the specific temperature may be 30° C. lower than the melting point (or the liquid crystal transition temperature) of the liquid crystal polymer film 120 (prior to the heating), or the specific temperature may be 25° C. lower than the melting point (or the liquid crystal transition temperature) of the liquid crystal polymer film 120 (prior to the heating), or the specific temperature may be 20° C. lower than the melting point (or the liquid crystal transition temperature) of the liquid crystal polymer film 120 (prior to the heating), or the specific temperature may be 15° C. lower than the melting point (or the liquid crystal transition temperature) of the liquid crystal polymer film 120 (prior to the heating), or the specific temperature may be 10° C. lower than the melting point (or the liquid crystal transition temperature) of the liquid crystal polymer film 120 (prior to the heating), or the specific temperature may be 5° C. lower than the melting point (or the liquid crystal transition temperature) of the liquid crystal polymer film 120 (prior to the heating). This invention is not limited to the temperatures described hereinbefore. It should be noted that the specific temperature may not be higher than the melting point or the liquid crystal transition temperature of the liquid crystal polymer film 120 prior to the heating.

In some embodiments, as shown in FIG. 5, the second composite layer 150 may be heated in a series of heating stages performed by a plurality of heating zones. For example, the second composite layer 150 is heated in the first heating zone Z1 for about 4 hours at a temperature 30° C. lower than the melting point (or liquid crystal transition temperature) of the liquid crystal polymer film 120 prior to the heating. The second composite layer 150 is heated in the second heating zone Z2 for about 6 hours at a temperature 25° C. lower than the melting point (or liquid crystal transition temperature) of the liquid crystal polymer film 120 prior to the heating. The second composite layer 150 is heated in the third heating zone Z3 for about 2 hours at a temperature 20° C. lower than the melting point (or liquid crystal transition temperature) of the liquid crystal polymer film 120 prior to the heating. The second composite layer 150 is heated in the fourth heating zone Z4 for about 3 hours at a temperature 15° C. lower than the melting point (or liquid crystal transition temperature) of the liquid crystal polymer film 120 prior to the heating. The second composite layer 150 is heated in the fifth heating zone Z5 for about 1 hour at a temperature 10° C. lower than the melting point (or liquid crystal transition temperature) of the liquid crystal polymer film 120 prior to the heating. It should be noted that in the series of heating stages, the heating temperature of each heating stage should be higher than the heating temperature of the previous stage, and the time period of heating can be adjusted according to the demand. That is, each heating zone provides the heat treatment at a different temperature and the temperatures of the heating zones are increased in sequence from the beginning end of the path to the terminal end of the path.

In some embodiments of the present disclosure, the separation member 190 can separate the heated liquid crystal polymer film 120 from the substrate. The separation method is not particularly limited. In some embodiments, a peeling-roller member may be used in the separation member 190. That is, the liquid crystal polymer 120 may be separated from the second composite layer 150, in which the upper peeling roller r3 and the lower peeling roller r4 are used. It should be noted that, the melting point or the liquid crystal transition temperature of the liquid crystal polymer film 120 after the heating is higher than that before the heating.

It should be noted that the method of processing the liquid crystal polymer film in the present disclosure can be carried out in a continuous or discontinuous manner according to the demand, and each step performed by the device of processing the liquid crystal polymer film in the present disclosure can be processed continuously.

In summary, the present disclosure provides a method and a device of processing a liquid crystal polymer film for increasing the melting point (or the liquid crystal transition temperature), as described above, to obtain liquid crystal polymer films with different melting points (or the liquid crystal transition temperature). In practical application (such as manufacturing multi-layer boards), the liquid crystal polymer film having the lower melting point can be applied for the dielectric layer closer to the core layer. Conversely, the liquid crystal polymer film having the higher melting point (or the liquid crystal transition temperature) can be applied for the dielectric layer more distant to the core layer. In other words, regardless of the heat received by the liquid crystal polymer film in each laminated layer being different, each of the dielectric layers can still exert its advantageous function because the laminated liquid crystal polymer films have different melting points (or liquid crystal transition temperature).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of processing a liquid crystal polymer film, the method comprising steps of:
   providing a substrate comprising a patterned metal substrate, wherein the patterned metal substrate comprisese a trench and two strip-shaped platforms, and the strip-shaped platforms protrude from two sides of the trench;
   providing a liquid crystal polymer film;
   laminating the liquid crystal polymer film with the substrate to form a composite layer;
   heating the composite layer at a temperature; and
   separating the heated liquid crystal polymer film from the substrate to obtain a processed liquid crystal polymer film.

2. The method of claim 1, wherein the patterned metal substrate further includes a plurality of openings recessed from the strip-shaped platforms at the two sides of the trench, and the openings are connected to the trench.

3. The method of claim 1, wherein the step of laminating the liquid crystal polymer film with the substrate includes laminating the liquid crystal polymer film on the trench of the patterned metal substrate.

4. The method of claim 3, wherein the laminated liquid crystal polymer film has a top that is lower than a top surface of the strip-shaped platforms.

5. The method of claim 1, after the step of laminating the liquid crystal polymer film with the substrate, further including rolling the composite layer into a roll.

6. The method of claim 1, wherein each of the steps of laminating the liquid crystal polymer film with the substrate, heating the composite layer at the temperature, and separating the heated liquid crystal polymer film from the substrate includes continuously transporting the composite layer.

7. The method of claim 1, wherein the steps of laminating the liquid crystal polymer film with the substrate and heating the composite layer at the temperature are performed simultaneously.

8. The method of claim 1, wherein the step of heating the composite layer at the temperature includes heating the composite layer for a time period of 1 hour to 24 hours.

9. The method of claim 1, wherein during the step of heating the composite layer at the temperature, the temperature is lower than a melting point or a liquid crystal transition temperature of the liquid crystal polymer film before heating.

10. The method of claim 9, wherein the step of heating the composite layer at the temperature includes performing a series of heating stages to heat the composite layer.

11. The method of claim 10, wherein a heating temperature of each heating stage is higher than a heating temperature of a previous stage.

12. The method of claim 1, wherein the step of separating the heated liquid crystal polymer film from the substrate includes using a peeling-roller member having an upper peeling roller and a lower peeling roller to separate the liquid crystal polymer film from the substrate.

\* \* \* \* \*